United States Patent [19]
Chor

[11] Patent Number: 5,661,071
[45] Date of Patent: Aug. 26, 1997

[54] METHOD OF MAKING AN ANTIFUSE CELL WITH TUNGSTEN SILICIDE ELECTRODE

[75] Inventor: Calvin Leung Yat Chor, Singapore, Singapore

[73] Assignee: Chartered Semiconductor Manufacturing Pte Ltd, Singapore, Singapore

[21] Appl. No.: 625,276

[22] Filed: Apr. 1, 1996

[51] Int. Cl.$^6$ .................................................. H01L 21/70
[52] U.S. Cl. ..................... 438/530; 257/50; 257/530; 438/600; 438/954; 438/533
[58] Field of Search ........................... 437/60, 195, 922, 437/200; 257/50, 530

[56] References Cited

U.S. PATENT DOCUMENTS

| | | | |
|---|---|---|---|
| 4,796,074 | 1/1989 | Roesner | 357/51 |
| 4,943,538 | 7/1990 | Mohsen et al. | 437/922 |
| 5,057,451 | 10/1991 | McCollum | 437/922 |
| 5,087,958 | 2/1992 | Chen et al. | 437/922 |
| 5,110,754 | 5/1992 | Lowrey et al. | 437/922 |
| 5,219,782 | 6/1993 | Liu et al. | 437/922 |
| 5,242,851 | 9/1993 | Choi | 437/60 |
| 5,282,158 | 1/1994 | Lee | 365/96 |
| 5,322,812 | 6/1994 | Dixit et al. | 437/60 |
| 5,324,681 | 6/1994 | Lowrey et al. | 437/60 |
| 5,350,710 | 9/1994 | Hong et al. | 437/60 |
| 5,508,220 | 4/1996 | Eltoukhy et al. | 437/60 |

OTHER PUBLICATIONS

Wolf et al., *Silicon Processing For The VLSI Era*, Vol. I, Lattice Press, 1986, pp. 384–388.

Chang et al, "Conductive Channel in ONO Formed by Controlled Dielectric Breakdown" in 1992 Symposium on VLSI Technology Digest, pp. 20–21.

*Primary Examiner*—Charles L. Bowers, Jr.
*Assistant Examiner*—Lynne A. Gurley
*Attorney, Agent, or Firm*—George O. Saile

[57] ABSTRACT

An improved antifuse design has been achieved by using a structure including a region of heavily doped N type silicon coated with a layer of ONO (oxide-nitride-oxide). Top contact to the ONO is made through a layer of tungsten silicide sandwiched between two layers of N type polysilicon. A cost effective method for manufacturing said antifuse structure is described.

6 Claims, 2 Drawing Sheets

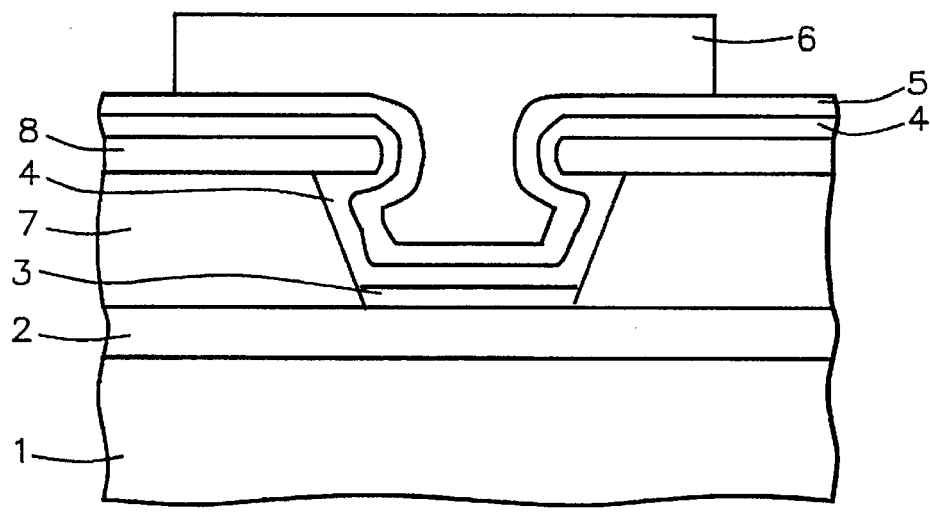
FIG. 1 - Prior Art
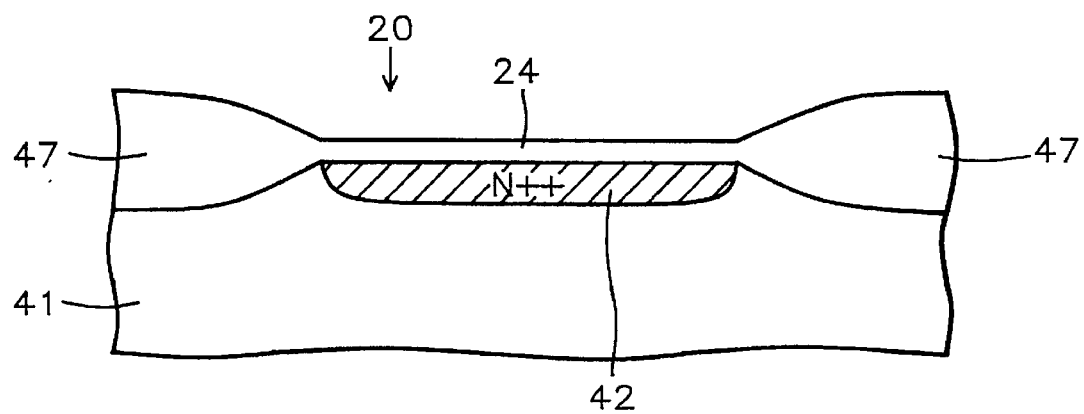
FIG. 2

METHOD OF MAKING AN ANTIFUSE CELL WITH TUNGSTEN SILICIDE ELECTRODE

BACKGROUND OF THE INVENTION

(1) Field of the Invention

The invention relates to the general area of programmable logic and memory, more particularly to antifuses for use in those technologies.

(2) Description of the Prior Art

In recent years the popularity of field programmable logic and write-once memories has grown significantly. These systems are generally based on antifuses. The latter are connections between wires that are initially open circuits but which can, through suitable external means, be selectively (and irreversibly) converted to short circuits.

One of the ways to activate an antifuse is by applying a suitable voltage (generally less than about 20 volts) across it. This causes the antifuse to change from its insulating to its conducting state in a few microseconds. For a typical antifuse of the current art, having an area of about one square micron, the resistance in the open state will be about $10^9$ ohms while the resistance in the conducting state will be about 500 ohms.

Many antifuse systems are based on amorphous silicon, which has high resistivity, but which, after heating, recrystallizes and drops its resistivity substantially. An example of this type of antifuse is given by Roesner (U.S. Pat. No. 4,796,074 January 1989). Other types of material mentioned by Roesner include germanium, carbon and tin and all depend on a change in grain size from amorphous, or very small crystallites, to relatively large grains. An additional drop in resistivity is achieved by the activation of interstitial dopant atoms (such as might be introduced through ion implantation). Thus Roesner teaches that the maximum temperature to which antifuse material may be exposed during processing must be less than about 600° C.

A number of improvements in the details of how to manufacture antifuses of the amorphous silicon type have been described by Dixit (U.S. Pat. No. 5,322,812 June 1994). Of particular importance is the maintenance of a high level of cleanliness. The maximum processing temperature is kept to about 540° C. and great care is taken to avoid the presence of nitrogen since small amounts of silicon nitride were found to degrade the performance of the antifuses.

An alternative antifuse system to the amorphous semiconductor variety discussed above is one that is based on oxide-nitride-oxide (ONO). ONO comprises a structure of three layers—silicon oxide, silicon nitride, and silicon oxide. When such a structure is subjected to a suitable applied voltage its resistance changes from about $10^9$ ohms to about 500 ohms by blowing up the ONO dielectric.

An example of an antifuse based on the ONO system is shown in FIG. 1. The ONO System has been discussed by, for example, S. Chiang et al. in the 1992 Symposium on VLSI Technology Digest pp. 20–21. Layer 2 of heavily doped N type silicon is in contact with silicon substrate 1. Layer 3 comprises thermal silicon oxide, typically about 38 Angstroms thick. Layer 4 comprises silicon nitride, typically about 75 Angstroms thick, while layer 5 comprises silicon oxide, typically about 28 Angstroms thick. Layer 6 is a 'cap' for the antifuse comprising a layer of heavily doped N type silicon about 4,000 Angstroms thick. Layer 6 will also serve as an electrical connector to other parts of the integrated circuit (IC) of which it is a part. Layer 7 comprises field oxide, about 1,300 Angstroms thick, whose purpose is to isolate the antifuse from other parts of the IC.

Layer 8 in FIG. 1 comprises silicon nitride and is used as a mask during processing to define the area of the antifuse. Its thickness is generally about 400 Angstroms.

SUMMARY OF THE INVENTION

It has been an object of the present invention to provide an antifuse structure that has improved characteristics relative to similar antifuse structures known to the prior art.

Another object of the present invention has been to provide an antifuse structure that has lower cost and higher speed than similar antifuse structures known to the prior art.

Yet another object of the present invention has been to provide a method for manufacturing said antifuse structure.

These objects have been achieved in a structure comprising a region of heavily doped N type silicon coated with a layer of ONO (oxide-nitride-oxide). Top contact to the ONO is made through a layer of tungsten silicide sandwiched between two layers of N type polysilicon. A cost effective method for manufacturing said antifuse structure is described.

BRIEF DESCRIPTION OF THE DRAWINGS

FIG. 1 shows a typical antifuse structure of the prior art.

FIG. 2 is the starting point of a process for the manufacture of an antifuse structure according to the present invention.

DESCRIPTION OF THE PREFERRED EMBODIMENTS

The present invention is an antifuse system based on ONO but incorporating a number of changes and improvements relative to the current art as seen earlier in FIG. 1.

Figure 4:
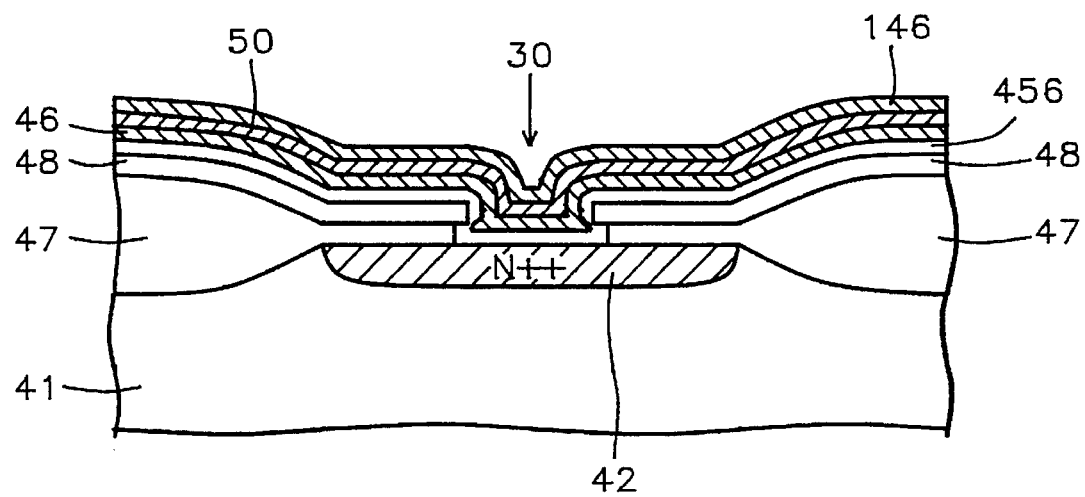
FIG. 4 shows the finished structure that comprises the antifuse of the present invention.

FIG. 4 shows, in schematic cross-section, a view of the antifuse structure of the present invention. Silicon substrate 41 has been provided with a layer of field oxide 47 in which are active regions, such as 30 at the bottom of which is a layer of N type silicon 42, heavily doped to a donor concentration between about $10^{19}$ and $10^{22}$ atoms/cc. A silicon nitride mask 48 lies over the field oxide and defines the actual area of the antifuse. Said area is typically between about 0.25 and 1.50 sq. microns.

Layer 456 is the actual ONO layer and comprises a first layer of silicon oxide in direct contact with N++ region 42, preferably between about 28 and 50 Angstroms thick, a layer of silicon nitride, between about 60 and 90 Angstroms thick, and a second layer of silicon oxide, between about 20 and 40 Angstroms thick. Additionally, said first layer of silicon oxide is also heavily doped with donor type impurities, such as arsenic and phosphorus, to a concentration between about $10^{16}$ and $10^{19}$ atoms/cc. These high doping levels are used to achieve the necessary high N++ doping of layer 42.

ONO layer 456 is covered by a layer of N type polysilicon 46 which is between about 1,400 and 2,000 Angstroms thick (typically about 1,700 Angstroms). Polysilicon layer 46 is covered by a layer of tungsten silicide 50, between about 1,200 and 1,700 Angstroms thick (typically 1,400–1,600 Angstroms) and it, in turn, is covered by second polysilicon layer 146, between about 450 and 650 Angstroms thick (typically 500–600 Angstroms) which serves as the cap for the structure.

We now describe a method for manufacturing the antifuse structure discussed above. Referring to FIG. 2, silicon substrate 41 is covered with a layer of field oxide 47 which is then removed in regions such as 20 wherever access to the underlying silicon is needed to form active regions. In this instance, the silicon in active region 20 is subjected to implantation thereby forming layer of heavily doped N type silicon 42. Said ion implantation step comprises two stages. First, phosphorus atoms are implanted to a concentration between about $10^{13}$ and $10^{14}$ atoms/cm$^2$ (typically 1–4×$10^{13}$ atoms/cm$^2$) followed by arsenic atoms to a concentration between about $10^{15}$ and $10^{16}$ atoms/cm$^2$ (typically 3–6×$10^{15}$ atoms/cm$^2$).

Heavily doped N type layer 42 is then thermally oxidized to form first layer of silicon oxide 24 on its surface. The structure is then heated to between 850° and 1,000° C., for between about 50 and 400 minutes in an atmosphere of dry oxygen. This causes drive-in of N type dopant to form the heavily doped region 42 as well as driving N type dopant atoms into layer 24 (from layer 42), resulting in a thickness value for layer 24 between 800 and 1,500 Angstroms.

Figure 3:
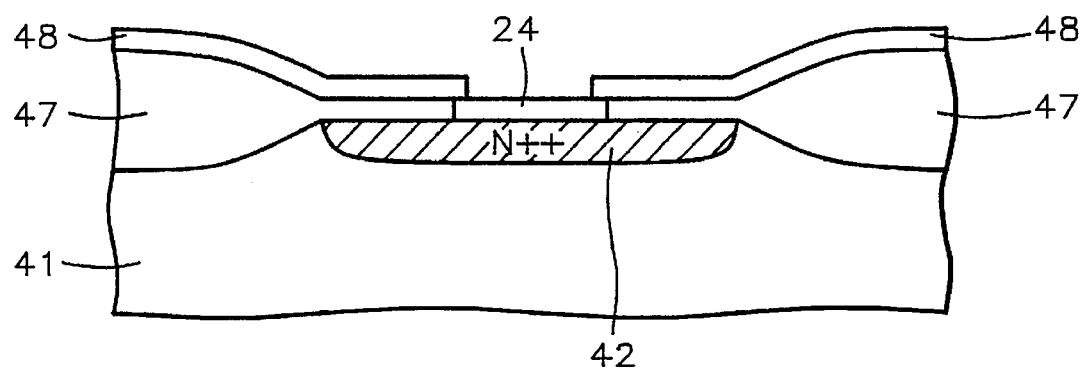
FIG. 3 is an intermediate step in said process.

Referring now to FIG. 3, silicon nitride layer 48, between about 200 and 700 Angstroms thick, is deposited onto the structure (using chemical vapor deposition (CVD)) and an opening is plasma etched in 48, down to the level layer 24, to act as a mask that will define the area of the antifuse. All of layer 24 is now removed by etching it in buffered hydrofluoric acid (HF:H$_2$O:NH$_4$F). Typically between about 1,000 and 2,000 Angstroms are removed during this operation which is for the purpose of exposing the ONO region.

Referring now to FIG. 4, formation of the ONO layer 456 is now completed by growing a layer of thermal silicon oxide on the ONO opening (60–120 minutes in a 1–20% oxygen atmosphere at 700°–800° C.) along with the deposition of the nitride and second oxide layers (not explicitly shown in the figure) using low pressure CVD and thermal oxidation (50–200 minutes in an oxygen atmosphere containing 1–5% hydrogen chloride at 900°–950° C.), respectively. Next, first N type polysilicon layer 46 is deposited over the ONO, followed by the deposition of tungsten silicide layer 50, using CVD, and finally by second polysilicon layer 146.

It has been our experience that the antifuse structure of the present invention has a number of advantages over similar structures associated with the current art. These advantages are summarised below in TABLE I. They show that the present invention offers lower resistance (thus higher speed) than the prior art due to the tungsten silicide interconnection on the top electrode (layer 50).

TABLE I

|  | amorph. | ONO prior art | ONO this invn. |
|---|---|---|---|
| open R | megohms | gigaohms | gigaohms |
| short R | >1,000 ohms | about 500 ohms | about 200 ohms |
| pgm. V | >20 volts | >20 volts | >20 volts |
| cost | HIGH | MEDIUM | LOW* |
| Reliability | POOR | GOOD | EXCELLENT |

*for higher speed parts

While the invention has been particularly shown and described with reference to the preferred embodiments thereof, it will be understood by those skilled in the art that various changes in form and details may be made without departing from the spirit and scope of the invention.

What is claimed is:

1. A method for manufacturing an antifuse cell comprising:

providing a silicon substrate;

covering said silicon substrate with a layer of field oxide except where an active region for an antifuse cell is to be located;

forming a layer of heavily doped N type silicon, in said silicon substrate, at said active region;

thermally oxidizing said heavily doped N type silicon to form a first layer of silicon oxide on its surface;

heating said silicon substrate, thereby driving N type dopant into said substrate and growing oxide on said heavily doped N type silicon layer;

depositing a first layer of silicon nitride on said first layer of silicon oxide and forming an opening in said silicon nitride layer down to the level of the first layer of silicon oxide;

removing said first layer of silicon oxide by etching it in buffered hydrofluoric acid;

forming an ONO layer by:

growing a second layer of silicon oxide on said heavily doped N type silicon layer, depositing a second layer of silicon nitride, and growing a third layer of silicon oxide on said second layer of silicon nitride;

depositing a first layer of N type polysilicon on said third layer of silicon oxide to a thickness between 1,400 and 2,000 Angstroms;

depositing a layer of tungsten silicide on said first layer of N type polysilicon to a thickness between 1,200 and 1,700 Angstroms; and forming a polysilicon cap on said layer of tungsten silicide to a thickness between 450 and 650 Angstroms.

2. The method of claim 1 wherein heating said silicon substrate, for the purpose of driving N type dopant into the silicon substrate, further comprises exposure to a temperature between about 850° and 1,000° C. for between about 50 and 400 minutes in an atmosphere of dry oxygen.

3. The method of claim 1 wherein said first layer of silicon nitride is deposited to a thickness between about 200 and 700 Angstroms.

4. The method of claim 1 wherein said first and second layers of silicon nitride are deposited by low pressure chemical vapor deposition.

5. The method of claim 1 wherein the amount of said first layer of silicon oxide that is removed by etching in buffered hydrofluoric acid is between about 1,000 and 2,000 Angstroms.

6. The method of claim 1 wherein said layer of tungsten silicide is deposited by chemical vapor deposition.

* * * * *